(12) United States Patent
Jenkins

(10) Patent No.: US 7,078,944 B1
(45) Date of Patent: Jul. 18, 2006

(54) POWER ON RESET CIRCUIT

(75) Inventor: Julian Jenkins, Santa Cruz, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

(21) Appl. No.: 10/857,039

(22) Filed: May 28, 2004

Related U.S. Application Data

(60) Provisional application No. 60/487,752, filed on Jul. 16, 2003.

(51) Int. Cl.
  *H03K 17/22* (2006.01)
(52) U.S. Cl. ...................................... 327/143; 327/198
(58) Field of Classification Search ................ 327/143, 327/198
  See application file for complete search history.

(56) References Cited

U.S. PATENT DOCUMENTS

| | | | | |
|---|---|---|---|---|
| 5,115,146 A | * | 5/1992 | McClure ...................... | 327/143 |
| 5,187,389 A | * | 2/1993 | Hall et al. ..................... | 327/50 |
| 5,394,104 A | * | 2/1995 | Lee .............................. | 327/143 |
| 5,523,709 A | * | 6/1996 | Phillips et al. ............... | 327/143 |
| 5,528,182 A | * | 6/1996 | Yokosawa ..................... | 327/143 |
| 5,844,434 A | * | 12/1998 | Eschauzier ................... | 327/143 |
| 6,060,918 A | * | 5/2000 | Tsuchida et al. ............. | 327/143 |
| 6,204,701 B1 | * | 3/2001 | Tsay et al. .................... | 327/143 |
| 6,271,714 B1 | * | 8/2001 | Shin ............................. | 327/143 |
| 6,437,614 B1 | * | 8/2002 | Chen ............................ | 327/143 |
| 6,677,787 B1 | * | 1/2004 | Kumar et al. ................ | 327/143 |
| 6,879,194 B1 | * | 4/2005 | Caldwell ...................... | 327/143 |
| 2002/0027460 A1 | * | 3/2002 | Kobayashi et al. .......... | 327/143 |
| 2003/0011411 A1 | * | 1/2003 | Sterrantino et al. ......... | 327/143 |
| 2004/0012418 A1 | * | 1/2004 | Kim ............................. | 327/143 |
| 2004/0066218 A1 | * | 4/2004 | Suzuki ......................... | 327/143 |
| 2004/0189357 A1 | * | 9/2004 | Kang et al. .................. | 327/143 |
| 2005/0140406 A1 | * | 6/2005 | Rizzo et al. .................. | 327/143 |
| 2005/0195000 A1 | * | 9/2005 | Parker et al. ................ | 327/143 |

\* cited by examiner

*Primary Examiner*—Terry D. Cunningham
(74) *Attorney, Agent, or Firm*—Okamoto & Benedicto LLP

(57) ABSTRACT

In one embodiment, a power on reset circuit includes a process dependent element. The process dependent element may be designed to compensate for process and temperature effects that may vary a trip point of the power on reset circuit. The process dependent element may be configured to lower or raise the trip point. The process dependent element may be a diode connected transistor, for example.

6 Claims, 5 Drawing Sheets

POWER ON RESET CIRCUIT

REFERENCE TO RELATED APPLICATION

The present application claims the benefit of U.S. Provisional Application No. 60/487,752, filed on Jul. 16, 2003 by Julian Jenkins, which is incorporated herein by reference in its entirety.

BACKGROUND OF THE INVENTION

1. Field of the Invention

The present invention relates generally to electrical circuits, and more particularly but not exclusively to power on reset circuits.

2. Description of the Background Art

Power on reset circuits prevent invalid conditions in an electrical circuit by ensuring that the electrical circuit has sufficient power before allowing it to operate. In an integrated circuit chip, for example, a power on reset circuit may be employed to ensure that sufficient power supply voltage is available to the chip before the chip is enabled. The power on reset circuit enables the chip only when the power supply powering the chip is within a specified range. Otherwise, the power on reset circuit keeps the chip disabled. The voltage at which the power on reset circuit enables the chip is referred to as a "trip point." The signal used to enable or disable the chip is also referred to as a "power on reset signal."

FIG. 1 schematically shows an example power on reset circuit 100. Circuit 100 includes resistors R1, R2, R3, R4, and R5, capacitors C1 and C2, transistors M1 and M2, and an inverter 110. Circuit 100 is powered by a power supply labeled as $V_{SUPPLY}$. $V_{SUPPLY}$ is typically the same power supply providing power to the chip controlled by circuit 100.

Resistors R1, R2, R3, and R4 form a resistor ladder that produce a scaled version of $V_{SUPPLY}$. The scaled version of $V_{SUPPLY}$ appears on node vtrip, thereby controlling the voltage on the gate of transistor M1. When the scaled version of $V_{SUPPLY}$ reaches the threshold voltage of transistor M1, transistor M1 will turn ON, thereby pulling the input voltage to inverter 110 (see the node labeled as "vout") to ground. This results in the output 112 of inverter 110 (see the node labeled as "por_xl") to be at a logical HIGH state. A logical HIGH on output 112 enables the chip controlled by circuit 100. When $V_{SUPPLY}$ rises from ground to its operating level (e.g., after $V_{SUPPLY}$ has been turned OFF then ON), circuit 100 thus keeps the chip disabled until $V_{SUPPLY}$ rises to a level that is sufficient to turn ON transistor M1. The trip point of circuit 100 is the $V_{SUPPLY}$ voltage required to turn ON transistor M1.

The chip controlled by circuit 100 is disabled when output 112 is at a logical LOW. When the $V_{SUPPLY}$ voltage is below the trip point, transistor M1 is OFF and resistor R5 pulls the input voltage to inverter 110 to the $V_{SUPPLY}$ voltage. Inverter 110 will interpret that $V_{SUPPLY}$ voltage as a logical HIGH, thereby placing output 112 at a logical LOW. The logical LOW on output 112 serves as an active LOW reset signal, which resets the chip and keeps it disabled.

Capacitors C1 and C2 and transistor M2 help reduce the sensitivity of circuit 100 to noise. Capacitors C1 and C2 slow down the slew rate of nodes vtrip and vout, respectively, so that $V_{SUPPLY}$ has to exceed the trip point for a minimum amount of time before the voltage on $V_{OUT}$ crosses the threshold of inverter 110.

The $V_{SUPPLY}$ voltage below which transistor M1 turns OFF is referred to as a "falling trip point." Transistor M2 provides some hysteresis by modifying the falling trip point of circuit 100. After $V_{SUPPLY}$ rises above the trip point, transistor M1 turns ON, which in turn turns ON transistor M2. This results in transistor M2 shorting out resistor R4, thereby lowering the $V_{SUPPLY}$ voltage required to keep transistor M1 ON and lowering the falling trip point at which M1 turns OFF.

A problem with circuit 100 is that its trip point may vary widely due to variations in the properties of its components, most importantly transistor M1. These variations in component properties (e.g., transistor threshold voltage) are typically caused by unavoidable variations in the manufacturing process and changes in the temperature of the chip. The chip is designed to work across an expected range of processes and temperature. For example, the trip point of circuit 100 may vary from 0.35 volts to 0.9 volts from circuit to circuit. This wide trip point variation may consume a considerable portion of the available voltage range where the chip is to be disabled and enabled. Also, at process corners where transistor M1 has a low threshold voltage, there may not be sufficient voltage to turn ON transistor M2 at the rising trip point (i.e., trip point crossed by a rising $V_{SUPPLY}$), preventing hysteresis. This is specially problematic when circuit 100 is fabricated using low voltage processes (e.g., 1.2 volt or 1.5 volt processes).

SUMMARY

In one embodiment, a power on reset circuit includes a process dependent element. The process dependent element may be designed to compensate for process and temperature effects that may vary a trip point of the power on reset circuit. The process dependent element may be configured to lower or raise the trip point. The process dependent element may be a diode connected transistor, for example.

These and other features of the present invention will be readily apparent to persons of ordinary skill in the art upon reading the entirety of this disclosure, which includes the accompanying drawings and claims.

The use of the same reference label in different drawings indicates the same or like components.

DETAILED DESCRIPTION

In the present disclosure, numerous specific details are provided, such as examples of circuits, components, and methods, to provide a thorough understanding of embodiments of the invention. Persons of ordinary skill in the art will recognize, however, that the invention can be practiced without one or more of the specific details. In other instances, well-known details are not shown or described to avoid obscuring aspects of the invention.

Figure 1:
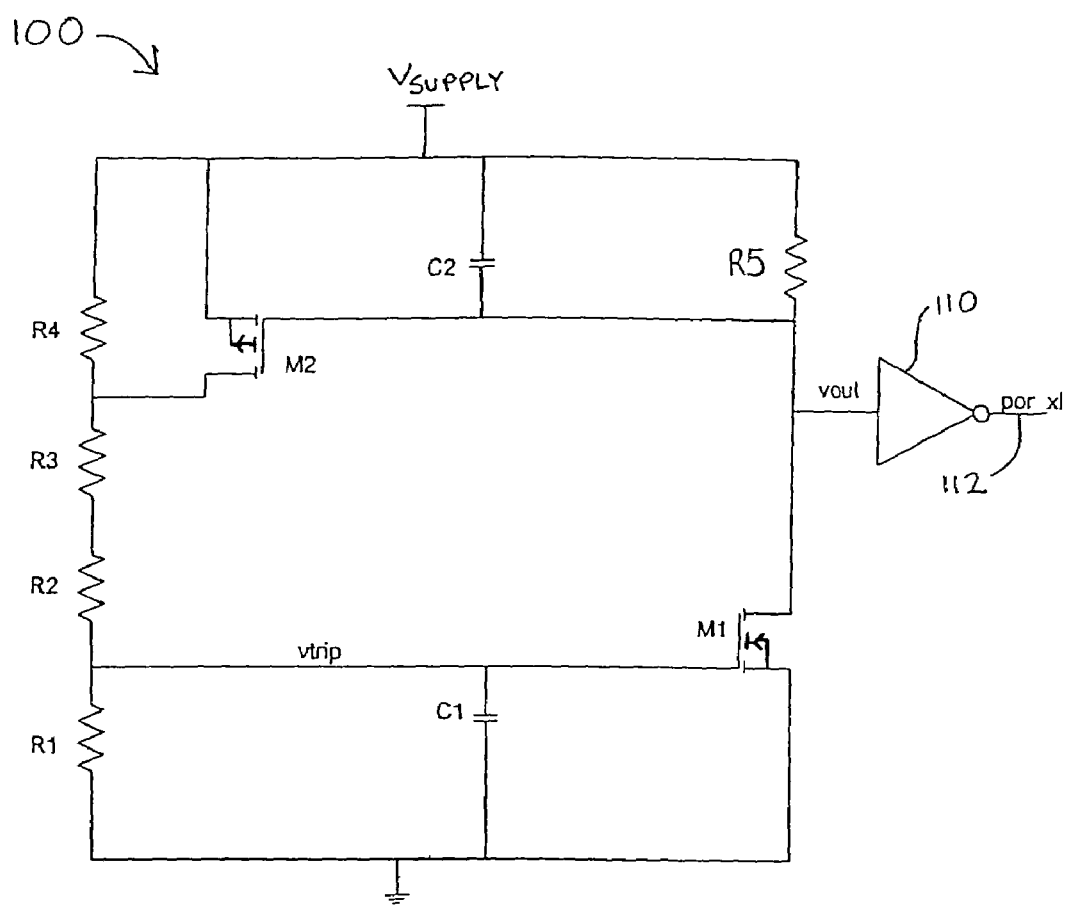
FIG. 1 schematically shows an example power on reset circuit.

Referring to FIG. 1, the threshold voltage of transistor M1 may vary with the process used to fabricate it. More specifically, the variations in the threshold voltage of transistor M1 may be caused by changes in process and temperature.

Figure 2:
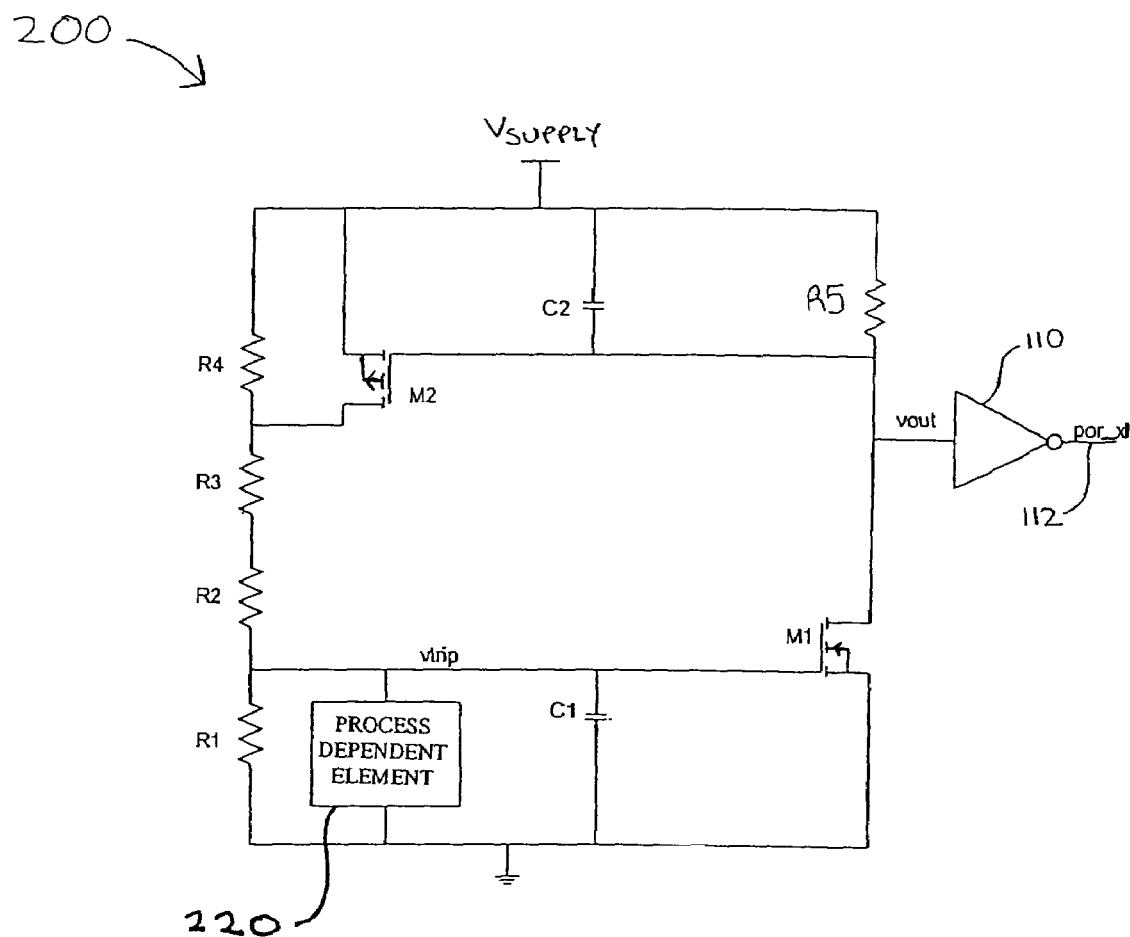
FIG. 2 schematically shows a power on reset circuit in accordance with an embodiment of the present invention.

FIG. 2 schematically shows a power on reset circuit 200 in accordance with an embodiment of the present invention. Circuit 200, and the later described circuits 400 and 500, may be part of an integrated circuit fabricated using CMOS technology. Circuit 200 may include a process dependent element 220 coupled between the gate of transistor M1 and ground. In the example of FIG. 2, the process dependent element 220 is in parallel with resistor R1 and capacitor C1, and changes the effective resistance between the gate of transistor M1 and ground. Under certain process corners, the process dependent element 220 permits current to leak to ground from the nodes at the gate of transistor M1, thus lowering the ratio of the voltage on node vtrip to $V_{SUPPLY}$ (i.e., $V_{TRIP}/V_{SUPPLY}$ ratio).

The resistance of the process dependent element 220 is process dependent to allow it to vary with process and temperature. The process dependent element 220 may be chosen such that its resistance tracks the threshold variation of transistor M1. The properties of the process dependent element 220 may be chosen such that under process and temperature corners where transistor M1 has a low threshold voltage, the process dependent element 220 conducts sufficient current to lower the voltage on node vtrip when the $V_{SUPPLY}$ voltage is near the trip point, thereby raising the trip point of circuit 200. Under process and temperature corners where transistor M1 has a high threshold voltage, the process dependent element 220 may be optimized to conduct relatively little current to have minimal effect on the trip point. In the example of FIG. 2, the process dependent element 220 thus effectively raises the trip point under process and temperature corners where it would be relatively low, while not appreciably affecting the trip point under process and temperature corners where the trip point would be relatively high. This reduces the overall trip point variation with process and temperature.

Figure 3:
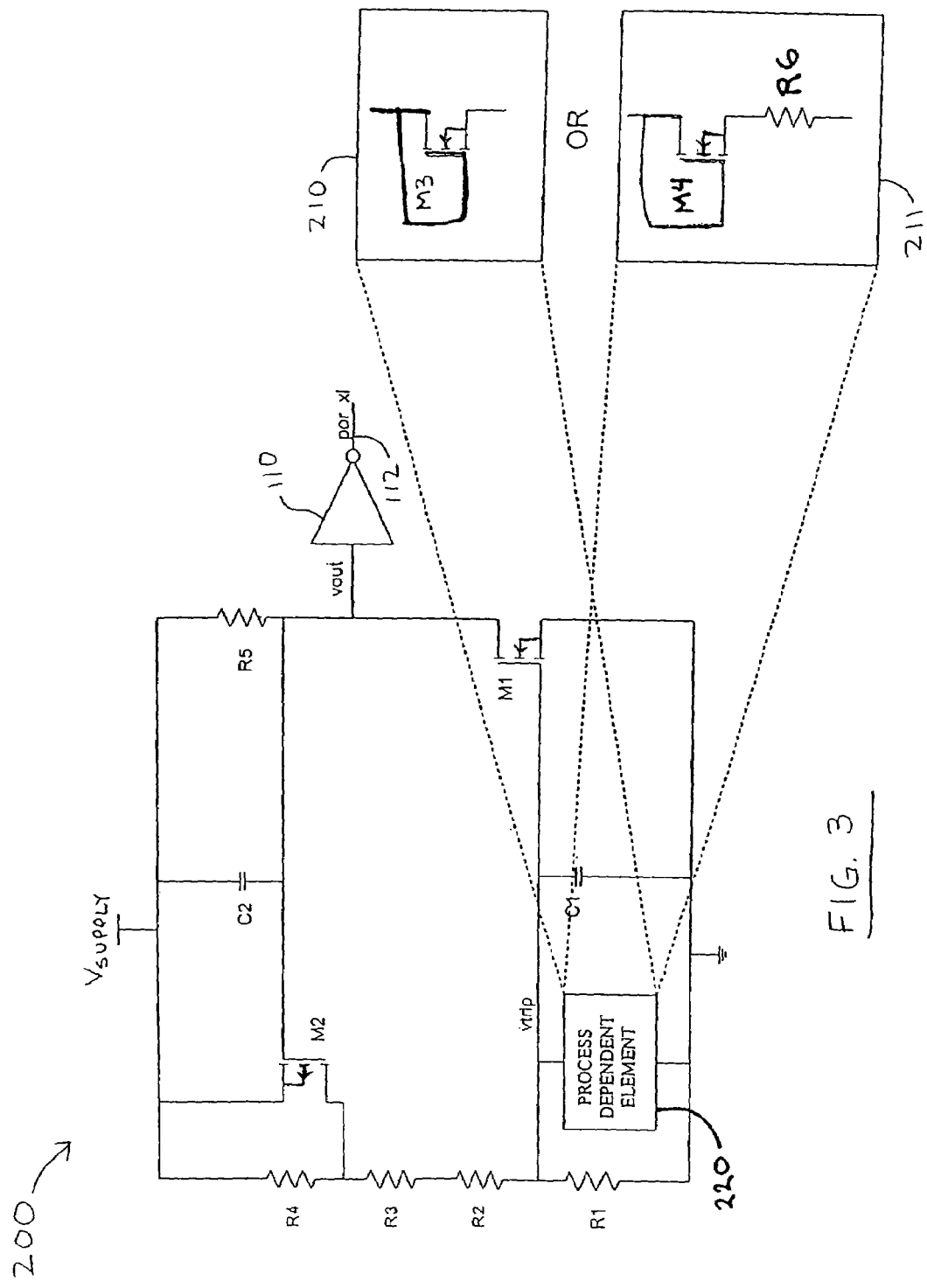
FIG. 3 schematically shows example process dependent elements in accordance with an embodiment of the present invention.

In one embodiment, the process dependent element 220 may be a diode connected NMOS transistor. FIG. 3 schematically shows example process dependent elements 220 in accordance with embodiments of the present invention. The example process dependent element in box 210 comprises a diode connected NMOS transistor M3, while that shown in box 211 comprises a diode connected NMOS transistor M4 with a series resistance R6. The process dependent element 220 may be fabricated using the same process used to fabricate transistor M1 and M2.

Figure 4:
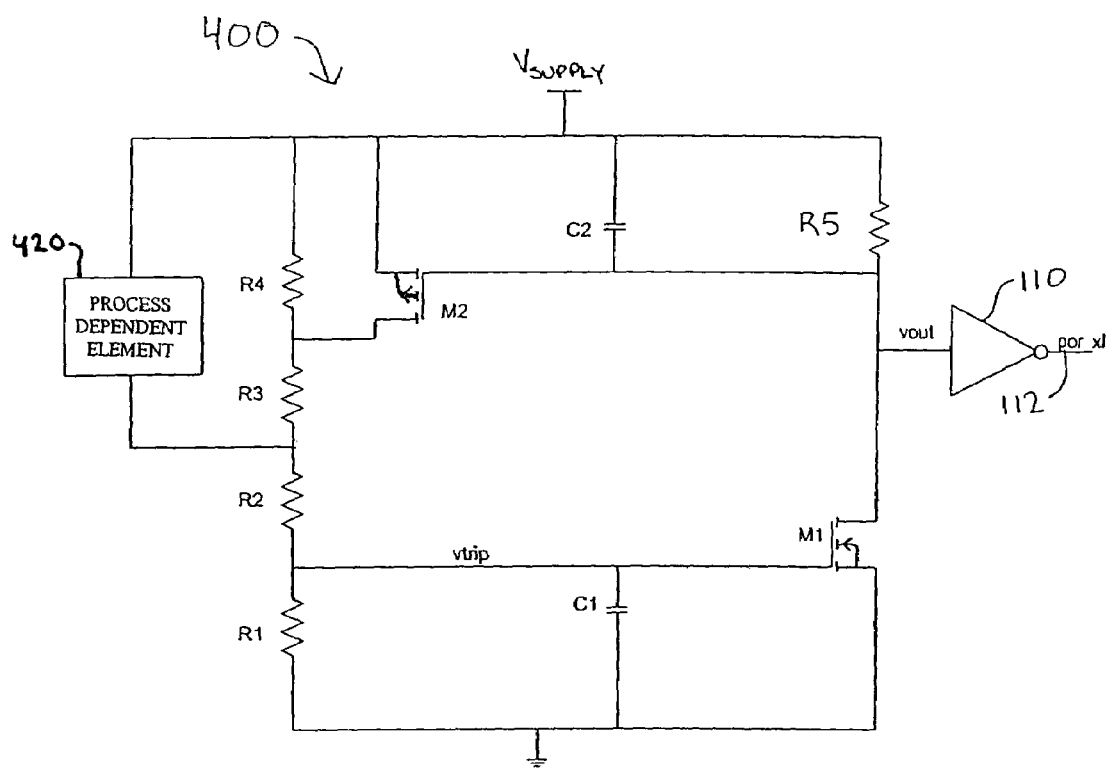
FIG. 4 schematically shows a power on reset circuit in accordance with an embodiment of the present invention.

FIG. 4 schematically shows a power on reset circuit 400 in accordance with an embodiment of the present invention. Circuit 400 includes a process dependent element 420 connected in parallel with resistors R3 and R4. In the example of FIG. 4, the process dependent element 420 changes the effective resistance between the gate of transistor M1 and Vsupply. Under certain process corners, the process dependent element 420 permits current to leak from $V_{SUPPLY}$ to the nodes at the gate of transistor M1, thus increasing the ratio of the voltage on node vtrip to $V_{SUPPLY}$ (i.e., $V_{TRIP}/V_{SUPPLY}$ ratio).

The resistance of the process dependent element 420 is process dependent to allow it to vary with process and temperature. The process dependent element 420 may be chosen such that its resistance tracks the threshold variation of transistor M1. The properties of the process dependent element 420 may be chosen such that under process and temperature corners where transistor M1 has a high threshold voltage, the process dependent element 420 conducts sufficient current to increase the voltage on node vtrip when the $V_{SUPPLY}$ voltage is near the trip point, thereby lowering the trip point of circuit 400 compared to circuit 100. Under process and temperature corners where transistor M1 has a low threshold voltage, the process dependent element 420 may be optimized to conduct relatively little current to have minimal effect on the trip point. In the example of FIG. 4, the process dependent element 420 thus effectively lowers the trip point under process and temperature corners where it would be relatively high, while not appreciably affecting the trip point under process and temperature corners where the trip point would be relatively low. This reduces the overall trip point variation with process and temperature.

As in circuit 200, the process dependent element 420 may be a diode connected NMOS transistor, such as those shown in boxes 210 and 211 of FIG. 3. NMOS transistors are the preferred transistors for a process dependent element because their square law characteristics allow more current to be conducted at higher $V_{SUPPLY}$ voltages (high threshold).

Figure 5:
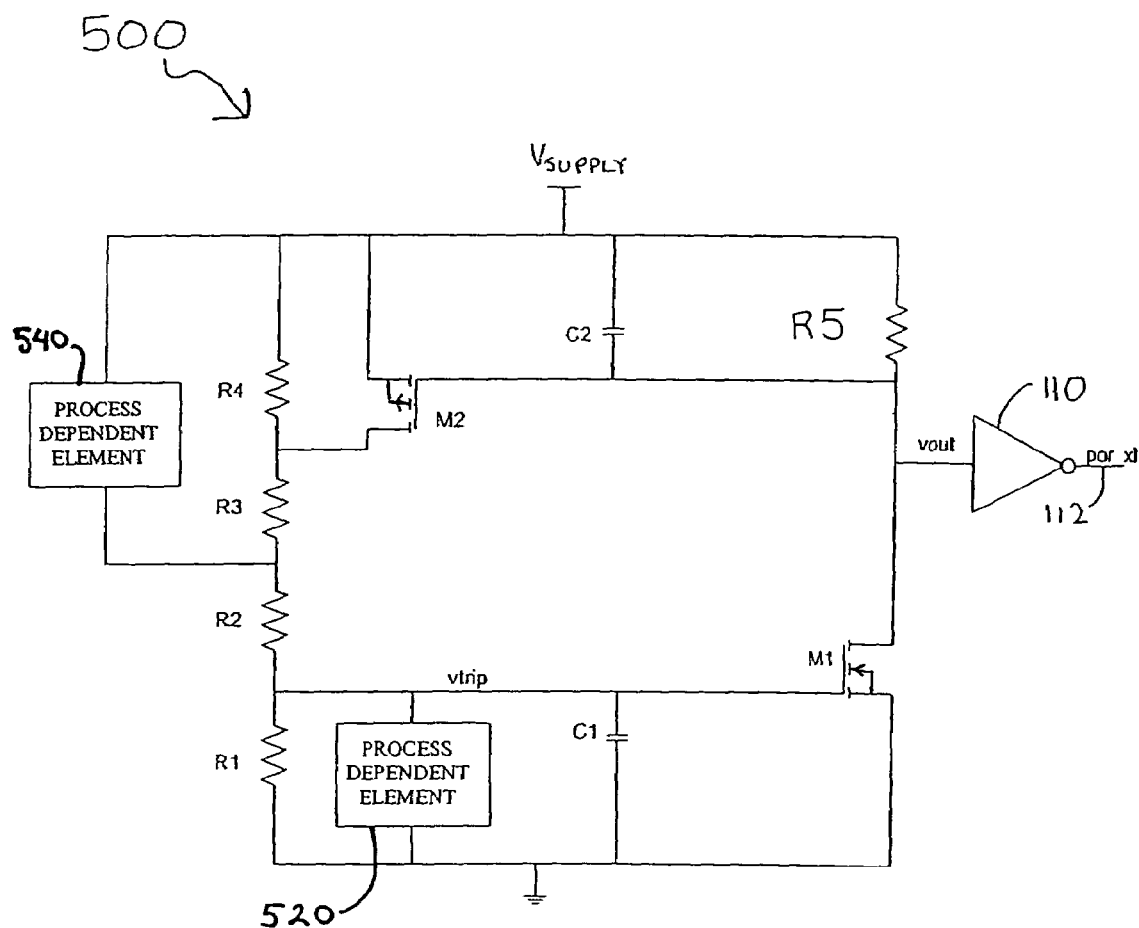
FIG. 5 schematically shows a power on reset circuit in accordance with an embodiment of the present invention.

FIG. 5 shows a power on reset circuit 500 in accordance with an embodiment of the present invention. Circuit 500 includes two process dependent elements namely, a process dependent element 520 and a process dependent element 540. Process dependent elements 520 and 540 may be the same as process dependent element 220. The process dependent element 520 raises the trip point under conditions where the trip point would be lower than expected (see circuit 200), while the process dependent element 540 lowers the trip point under conditions where the trip point would be higher than expected (see circuit 400).

While specific embodiments of the present invention have been provided, it is to be understood that these embodiments are for illustration purposes and not limiting. Many additional embodiments will be apparent to persons of ordinary skill in the art reading this disclosure.

What is claimed is:

1. A power on reset circuit comprising:
   a resistor ladder providing a scaled version of a power supply voltage;
   a first MOS transistor configured to control generation of a power on reset signal, the first MOS transistor being coupled to a pull-up resistor; and
   a first process dependent element coupled to a node of the resistor ladder, the first process dependent element comprising a second MOS transistor, the first process dependent element and the first MOS transistor being formed in an integrated circuit using a same fabrication process, the first process dependent element being configured to adjust a first trip point of the power on reset circuit to compensate for a variation in a threshold voltage of the first MOS transistor due to a variation in the fabrication process, wherein a resistance of the first process dependent element tracks the variation in the threshold voltage of the first MOS transistor;
   wherein the first process dependent element has a first end directly connected to a gate of the first MOS transistor and a second end directly connected to a ground.

2. The circuit of claim 1 wherein the first process dependent element changes the first trip point to a second trip point higher than the first trip point when the first MOS transistor has a relatively low threshold voltage due to the variation in the fabrication process.

3. The circuit of claim 1 wherein the first process dependent element comprises a diode connected MOS transistor.

4. The circuit of claim 1 wherein the first process dependent element comprises a diode connected MOS transistor coupled to a series resistance.

5. The circuit of claim 1 wherein the first process dependent element comprises an NMOS transistor connected as a diode.

6. A power on reset circuit comprising:
- a resistor ladder providing a scaled version of a power supply voltage;
- a first MOS transistor configured to control generation of a power on reset signal, the first MOS transistor being coupled to a pull-up resistor; and
- a first process dependent element coupled to a node of the resistor ladder, the first process dependent element comprising a second MOS transistor, the first process dependent element and the first MOS transistor being formed in an integrated circuit using a same fabrication process, the first process dependent element being configured to adjust a first trip point of the power on reset circuit to compensate for a variation in a threshold voltage of the first MOS transistor due to a variation in the fabrication process, wherein a resistance of the first process dependent element tracks the variation in the threshold voltage of the first MOS transistor;
- a second process dependent element configured to change the first trip point to a second trip point lower than the first trip point under conditions where the first trip point would be higher than expected; and
- wherein the first process dependent is configured to change the first trip point to a third trip point higher than the first trip point under conditions where the first trip point would be lower than expected.

* * * * *